United States Patent
Reche et al.

(10) Patent No.: US 8,058,163 B2
(45) Date of Patent: Nov. 15, 2011

(54) ENHANCED RELIABILITY FOR SEMICONDUCTOR DEVICES USING DIELECTRIC ENCASEMENT

(75) Inventors: John J. H. Reche, Phoenix, AZ (US); Michael E. Johnson, Phoenix, AZ (US); Guy F. Burgess, Phoenix, AZ (US); Anthony P. Curtis, Phoenix, AZ (US); Stuart Lichtenthal, Phoenix, AZ (US)

(73) Assignee: Flipchip International, LLC, Phoenix, AZ (US)

( * ) Notice: Subject to any disclaimer, the term of this patent is extended or adjusted under 35 U.S.C. 154(b) by 0 days.

(21) Appl. No.: 12/537,236

(22) Filed: Aug. 6, 2009

(65) Prior Publication Data

US 2010/0032836 A1    Feb. 11, 2010

Related U.S. Application Data

(60) Provisional application No. 61/087,109, filed on Aug. 7, 2008.

(51) Int. Cl.
*H01L 21/44* (2006.01)
(52) U.S. Cl. ............ 438/612; 438/613; 257/E23.021
(58) Field of Classification Search .......... 438/612, 438/613; 257/E23.021
See application file for complete search history.

(56) References Cited

U.S. PATENT DOCUMENTS

| | | |
|---|---|---|
| 6,287,893 B1 | 9/2001 | Elenius et al. |
| 6,441,487 B2 | 8/2002 | Elenius et al. |
| 6,445,069 B1 | 9/2002 | Ling et al. |
| 6,578,755 B1 | 6/2003 | Elenius et al. |
| 6,750,135 B2 | 6/2004 | Elenius et al. |
| 2002/0151164 A1* | 10/2002 | Jiang et al. ............ 438/613 |
| 2004/0217486 A1 | 11/2004 | Walter et al. |
| 2007/0111500 A1 | 5/2007 | Cowens et al. |

FOREIGN PATENT DOCUMENTS

KR    10-2000-0050695    8/2000

OTHER PUBLICATIONS

International Search Report for PCT/US2009/053205.

* cited by examiner

*Primary Examiner* — Alexander Ghyka
*Assistant Examiner* — Seavosh Nikmanesh
(74) *Attorney, Agent, or Firm* — Greenberg Traurig, LLP

(57) ABSTRACT

A method and device for enhanced reliability for semiconductor devices using dielectric encasement is disclosed. The method and device are directed to improving the reliability of the solder joint that connects the integrated circuit (IC) chip to the substrate. The method comprises applying a layer of a photoimageable permanent dielectric material to a top surface of the semiconductor device, and patterning the layer of the photoimageable permanent dielectric material to have an opening over each feature. The method further comprises dispensing or stencil printing fluxing material into the permanent dielectric material openings, and applying solder, which contains no flux, to a top surface of the fluxing material. In one or more embodiments, the method further comprises heating the semiconductor device to a reflow temperature appropriate for the reflow of the solder, thereby causing the solder to conform to sidewalls of the permanent dielectric material openings to form a protective seal.

20 Claims, 2 Drawing Sheets

ENHANCED RELIABILITY FOR SEMICONDUCTOR DEVICES USING DIELECTRIC ENCASEMENT

RELATED APPLICATION

This application claims the benefit of and priority to U.S. Provisional Application Ser. No. 61/087,109, filed Aug. 7, 2008, the contents of which are incorporated by reference herein in its entirety.

BACKGROUND

The present disclosure relates to enhanced reliability for semiconductor devices. In particular, it relates to enhanced reliability for semiconductor devices using dielectric encasement.

SUMMARY

The present disclosure relates to a method and device for enhanced reliability for semiconductor devices using dielectric encasement. In one or more embodiments, the method for enhanced reliability for semiconductor devices using dielectric encasement involves applying a layer of a photoimageable permanent dielectric material to a top surface of the semiconductor device, and patterning the layer of the photoimageable permanent dielectric material to have an opening over each feature.

In one or more embodiments, the layer of the photoimageable permanent dielectric material is a liquid dielectric. In alternative embodiments, the layer of the photoimageable permanent dielectric material is a dry film laminate. In some embodiments, the layer of the photoimageable permanent dielectric material is 1-300 μm (micrometer) thick. A thicker dielectric layer provides additional mechanical strength.

In some embodiments, the semiconductor device includes a substrate layer comprising silicon (Si). In one or more embodiments, the features of the semiconductor device may include, but are not limited to, solder bond pads, die streets, and test features. In at least one embodiment, the layer of the photoimageable permanent dielectric material overlaps an under bump metallurgy (UBM) by at least 1 micron.

In one or more embodiments, the method further comprises dispensing or stencil printing fluxing material into the permanent dielectric material openings, and applying solder, which contains no flux, to a top surface of the fluxing material. In at least one embodiment, the solder is at least one solder sphere and/or a solder paste. In one or more embodiments, the method further comprises heating the semiconductor device to a reflow temperature appropriate for the reflow of the solder, thereby causing the solder to conform to sidewalls of the permanent dielectric material openings to form a protective seal.

In some embodiments, the method for enhanced reliability for semiconductor devices using dielectric encasement comprises applying a layer of a photoimageable permanent dielectric material to a top surface of the semiconductor device; patterning the layer of the photoimageable permanent dielectric material to have an opening over each feature; dispensing solder, which contains flux, into the permanent dielectric material openings; and heating the semiconductor device to a reflow temperature appropriate for the reflow of the solder, thereby causing the solder to conform to sidewalls of the permanent dielectric material openings to form a protective seal.

In one or more embodiments, the device for enhanced reliability for semiconductor devices using dielectric encasement comprises a substrate layer, at least one input/output (I/O) pad, a passivation layer, at least one under bump metallurgy (UBM), a layer of a photoimageable permanent dielectric material, fluxing material, and at least one solder sphere, which contains no flux.

In some embodiments, at least one input/output (I/O) pad lies on a top surface of the substrate layer. Also, the passivation layer lies on a top surface of the substrate layer and lies on a portion of the top surface of each input/output (I/O) pad. In addition, at least one under bump metallurgy (UBM) lies on the top surface of each input/output (I/O) pad. The layer of the photoimageable permanent dielectric material lies on a top surface of the substrate layer and on a top surface of at least one under bump metallurgy (UBM), and the layer of the photoimageable permanent dielectric material is patterned to have an opening over each feature. The fluxing material lies inside the permanent dielectric material openings. Additionally, at least one solder sphere, which contains no flux, lies on a top surface of the fluxing material. The semiconductor device is heated to a reflow temperature appropriate for the reflow of at least one solder sphere, thereby causing at least one solder sphere to conform to sidewalls of the permanent dielectric material openings to form a protective seal.

In one or more embodiments, the device for enhanced reliability for semiconductor devices using dielectric encasement comprises a substrate layer, at least one input/output (I/O) pad, a passivation layer, at least one under bump metallurgy (UBM), a layer of a photoimageable permanent dielectric material, and at least one solder sphere, which contains flux.

In at least one embodiment, at least one input/output (I/O) pad lies on a top surface of the substrate layer. In addition, the passivation layer lies on a top surface of the substrate layer and lies on a portion of the top surface of each input/output (I/O) pad. Also, at least one under bump metallurgy (UBM) lies on the top surface of each input/output (I/O) pad. Additionally, the layer of the photoimageable permanent dielectric material lies on the top surface of the substrate layer and on a top surface of at least one under bump metallurgy (UBM). The layer of the photoimageable permanent dielectric material is patterned to have an opening over each feature. At least one solder sphere, which contains flux, lies inside the permanent dielectric material openings. The semiconductor device is heated to a reflow temperature appropriate for the reflow of at least one solder sphere, thereby causing at least one solder sphere to conform to sidewalls of the permanent dielectric material openings to form a protective seal.

DRAWINGS

These and other features, aspects, and advantages of the present disclosure will become better understood with regard to the following description, appended claims, and accompanying drawings where:

DESCRIPTION

Figure 1:
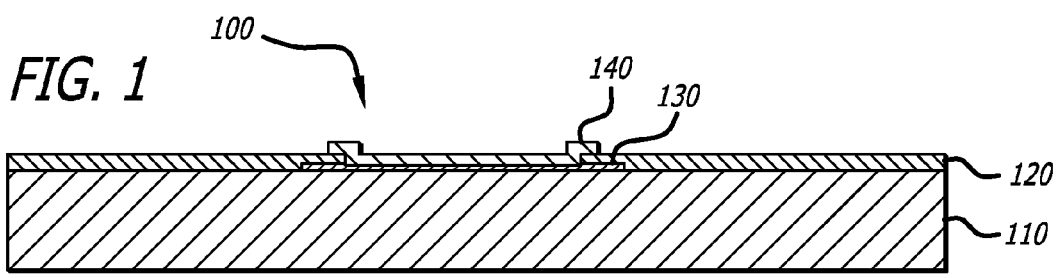
FIG. 1 is a cross-sectional drawing of a semiconductor device, in accordance with at least one embodiment of the present disclosure.

The methods and apparatus disclosed herein provide an operative system for enhanced reliability for semiconductor devices, or wafer level chip scale packages (WLCSP). Specifically, this system employs the use of dielectric encasement to achieve enhanced reliability for a semiconductor device.

The present disclosure relates to improvements in semiconductor device reliability performance, which is being demanded by original equipment manufacturers such as, but not limited to, cellular phone manufacturers. In particular, current semiconductor device technology is in need of improvements to the reliability of the solder joint connecting the chip to the substrate.

During the normal cycle of heating and cooling (which causes expansion and contraction, respectively), which occurs during the use of an electronic device, and during periodic accidental dropping by the consumer (which causes mechanical shock) of an electronic device such as, but not limited to, a cellular phone, the solder joint can break. The breaking of the solder joint will cause a disruption in the function of the electronic device. As such, thermal cycle testing and drop testing are a standard part of the reliability qualification for semiconductor device technologies.

Sealing improvements are needed between the solder and the underlying circuitry/metallization to protect against potential corrosive agents during subsequent processing of the electronic device and/or during the lifetime usage of the electronic device. The system of the present disclosure uses a material or a combination of materials that will not separate from the solder during the cool down phase of the reflow process, thereby creating a seal in the solder joint.

The process, method, system, apparatus, and structure taught in this present disclosure lead to an increase in reliability of performance of semiconductor devices by minimizing the impact of thermal expansion, contraction, and mechanical shock that an electronic device may experience. In addition, the process, method, system, apparatus, and structure disclosed in the present application will allow for better sealing and protection of the underlying structures against corrosion or contamination, which can lead to premature device failure or malfunction. The process, method, system, apparatus, and structure taught in the present disclosure allow for improvement of semiconductor device mechanical and thermal reliability as well as for improvement of protection of the underlying structures of the device from corrosion.

Various underfill and repassivation applications have been developed over the years. Wafer level chip scale packaging (WLCSP) repassivation applications disclosed in prior art involve applying a dielectric layer over a patterned under bump metallurgy (UBM) layer. In these applications, since the repassivation layer is applied over the under bump metallurgy (UBM), a sealing feature is created around the edges of the under bump metallurgy (UBM) pad. In addition, in industry, underfills have also been widely used. However, the use of underfills in industry has generally been limited to die level processing methods. Wafer level underfills have been disclosed in prior art. However, wafer level underfill processing and their resultant final structures are easily distinguishable from the process, method, system, apparatus, and structure that are disclosed in the present application.

The disclosed apparatus, system, method, process, and structure taught in the present application would likely be used by a company utilizing similar WLCSP packaging requiring maximal thermal cycling and mechanical robustness. In particular, these types of companies likely include, but are not limited to, an original equipment manufacturer (OEM) that requires this packaging design criteria and any company involved with manufacturing chip scale packaging (CSP) or any similar type of packaging. One method that can be used to determine if the technology of the present disclosure was utilized in manufacturing a semiconductor device involves deconstructing the device into x-sections, and visually examining the final device structure by using either a high magnification optical microscope or a scanning electron microscope (SEM). However, it should be noted that other various methods may also be employed.

In the following description, numerous details are set forth in order to provide a more thorough description of the system. It will be apparent, however, to one skilled in the art, that the disclosed system may be practiced without these specific details. In the other instances, well known features have not been described in detail so as not to unnecessarily obscure the system.

FIGS. 1 through 5 collectively illustrate the steps for creating semiconductor devices with enhanced reliability using dielectric encasement. FIG. 1 shows an illustration of a semiconductor device 100, in accordance with at least one embodiment of the present disclosure. In this figure, the semiconductor device 100 is depicted as including a substrate layer 110, an input/output (I/O) pad 130, a passivation layer 120, and an under bump metallurgy (UBM) 140. In one or more embodiments, various types of semiconductor material may be used for the substrate layer 110 including, but not limited to, silicon (Si).

In FIG. 1, an input/output (I/O) pad 130 lies on a top surface of the substrate layer 110. In one or more embodiments, at least one input/output (I/O) pad 130 is employed by the disclosed device. Also shown in this figure, a passivation layer 120 lies on the top surface of the substrate layer 110 as well as lies on a portion of the top surface of the input/output (I/O) pad 130. This figure also shows an under bump metallurgy (UBM) 140 lying on a top surface of the input/output (I/O) pad 130. In at least one embodiment, the under bump metallurgy (UBM) 140 includes a recess for accepting a solder sphere 510 (See FIG. 5).

Figure 2:
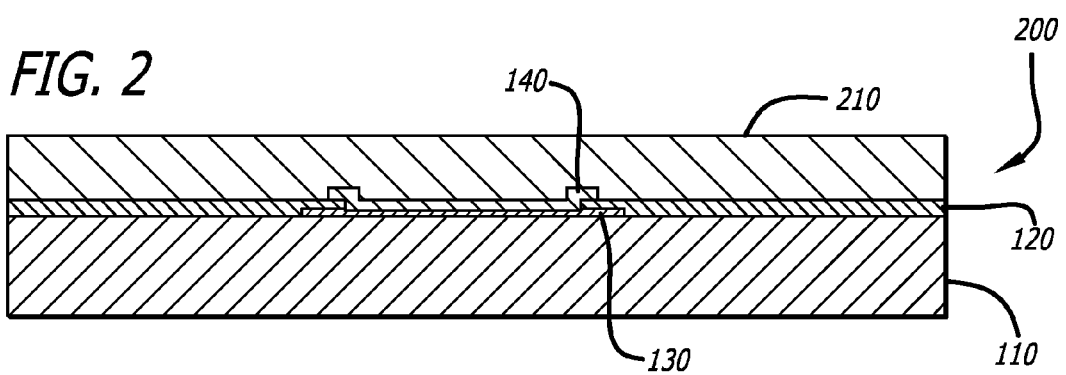
FIG. 2 is a cross-sectional drawing similar to that of FIG. 1, but shows the addition of a photoimageable permanent dielectric material applied to a top surface of the semiconductor device, in accordance with at least one embodiment of the present disclosure.

FIG. 2 illustrates the first step 200 for creating a semiconductor device 100 with enhanced reliability using dielectric encasement. FIG. 2 shows a semiconductor device 100 with the addition of a photoimageable permanent dielectric material 210 applied to the top surface of the semiconductor device 100. In this figure, a thick blanket coating of photoimageable permanent dielectric material 210 is applied to the top surface of the semiconductor device 100. This thick blanket coating 210 completely covers the top surface of the under bump metallurgy (140) as well as the top surface of the passivation layer 120 of the semiconductor device 100.

In one or more embodiments, the photoimageable permanent dielectric layer 210 may be either a liquid dielectric or a dry film laminate. In at least one embodiment, the dielectric material in the dielectric layer 210 is photodefineable or laser ablatable. In some embodiments, the photoimageable permanent dielectric layer 210 has a thickness in the range of 1-300 μm (micrometers). A thicker photoimageable permanent dielectric layer 210 provides additional mechanical strength to the semiconductor device 100.

Figure 3:
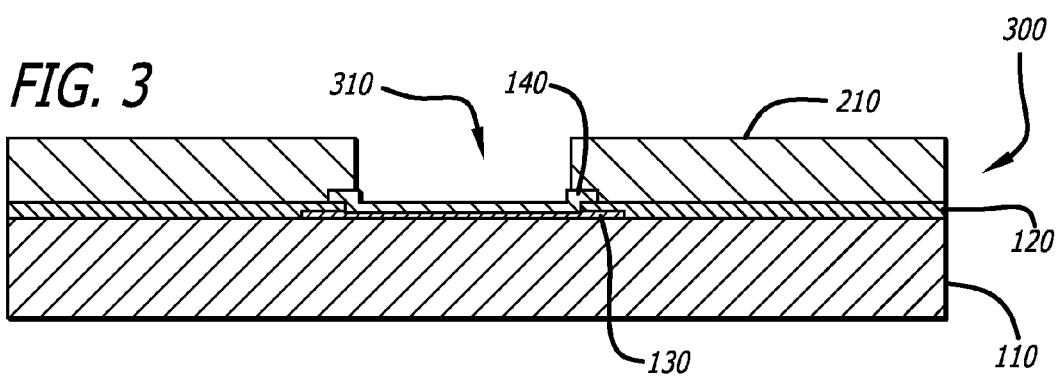
FIG. 3 is a cross-sectional drawing similar to that of FIG. 2, but shows a layer of the photoimageable permanent dielectric material that is patterned to have an opening over a single feature, in accordance with at least one embodiment of the present disclosure.

FIG. 3 illustrates the second step 300 for creating a semiconductor device 100 with enhanced reliability using dielectric encasement. FIG. 3 shows a layer of the photoimageable permanent dielectric material 210 that is patterned to have an opening 310 over a single feature of the semiconductor device 100. In this figure, the single feature is an under bump metallurgy (UBM) 140. In some embodiments, the photoimageable permanent dielectric layer 210 is patterned such that the photoimageable permanent dielectric material 210 overlaps the under bump metallurgy (UBM) 140 by at least one micron. In alternative embodiments, the photoimageable permanent dielectric layer 210 may be patterned to have an openings 310 over features including, but not limited to, solder bond pads, die streets, and test features.

Figure 4:
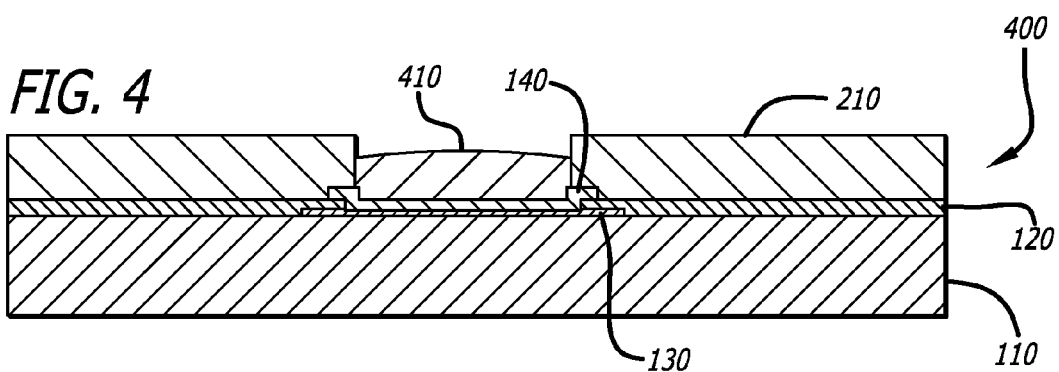
FIG. 4 is a cross-sectional drawing similar to that of FIG. 3, but shows the addition of fluxing material dispensed into or stencil printed onto the permanent dielectric material opening, in accordance with at least one embodiment of the present disclosure.

FIG. 4 illustrates the third step 400 for generating a semiconductor device 100 with enhanced reliability using dielectric encasement. FIG. 4 shows the addition of fluxing material 410 dispensed into or stencil printed onto the permanent dielectric material opening 310 of the semiconductor device 100. This figure illustrates a fluxing material type 410 being dispensed into or stencil printed onto at least one permanent dielectric material opening 310.

Figure 5:
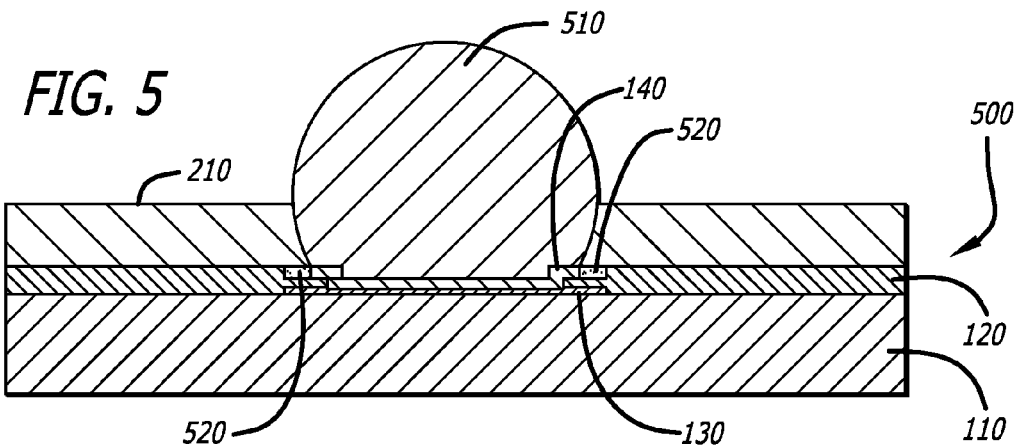
FIG. 5 is a cross-sectional drawing similar to that of FIG. 4, but shows the addition of a solder sphere placed onto a top surface of the fluxing material, in accordance with at least one embodiment of the present disclosure.

FIG. 5 depicts the fourth step 500 for manufacturing a semiconductor device 100 with enhanced reliability using dielectric encasement. In particular, FIG. 5 shows the addition of a solder sphere 510, which contains no flux, placed onto a top surface of the fluxing material 410. During this step, spheres of solder 510, which contain no flux, are dropped or applied onto the fluxing material 410, which has been dispensed into the permanent dielectric material openings 310 of the semiconductor device 100. In alternative embodiments, solder paste is employed instead of or in addition to a solder sphere 510.

In alternative embodiments, spheres of solder 510 containing flux are employed by the disclosed method and/or device. In these embodiments, no fluxing material 410 is required. As such, for these embodiments, spheres of solder 510 containing flux are dispensed directly into the permanent dielectric material openings 310 of the semiconductor device 100.

After the spheres of solder 510 are applied to the semiconductor device 100, the semiconductor device 100 is heated to a reflow temperature appropriate for the reflow of the solder spheres 510. During the reflow process, the solder material 510 fills and conforms to the sidewalls of the permanent dielectric openings 310, thereby forming a protective seal 520 against corrosive agents.

Figure 6:
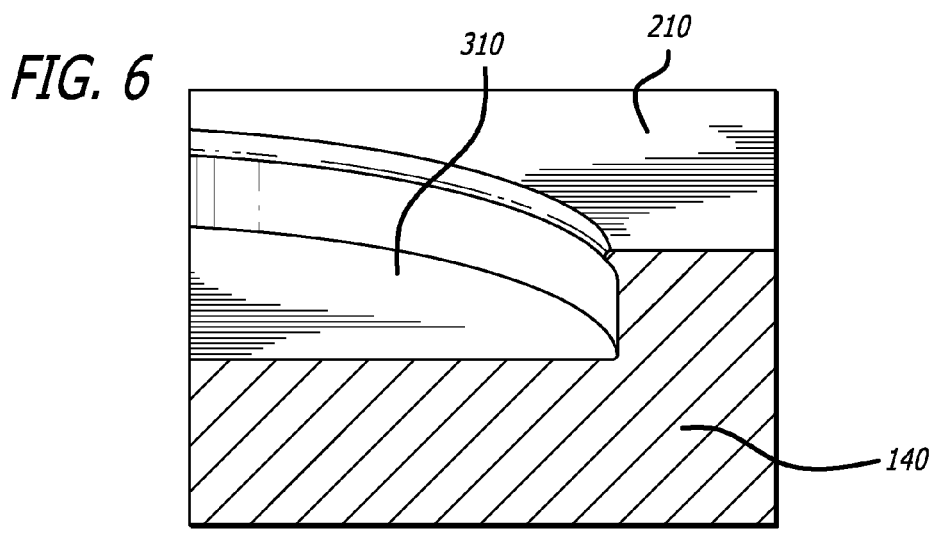
FIG. 6 is an illustration of a Scanning Electron Microscope (SEM) image showing the photoimageable permanent dielectric layer after patterning, in accordance with at least one embodiment of the present disclosure.
Figure 7:
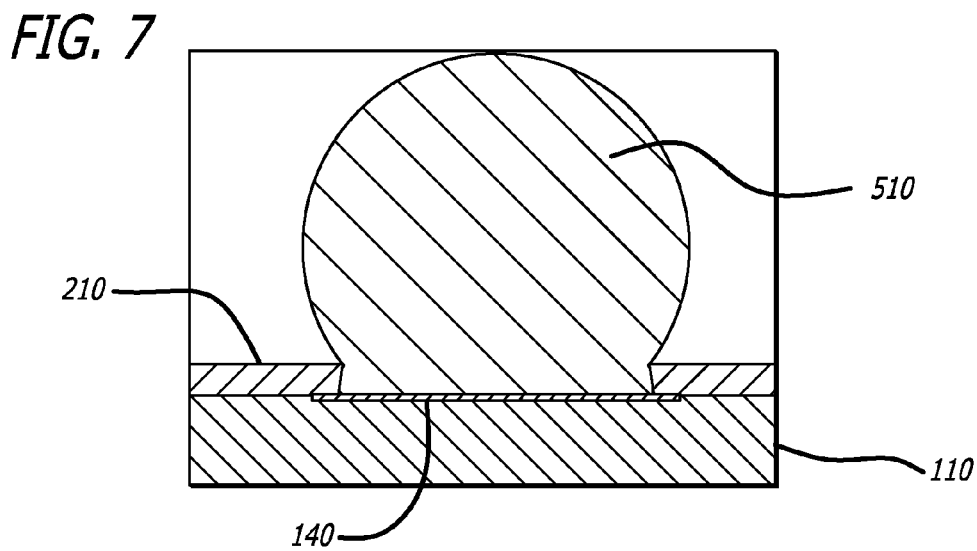
FIG. 7 is an illustration of a SEM image showing the final structure of the semiconductor device after reflow, in accordance with at least one embodiment of the present disclosure.

FIG. 6 contains an illustration of a Scanning Electron Microscope (SEM) image showing the photoimageable permanent dielectric layer 210 after patterning. In this figure, the photoimageable permanent dielectric material 210 is shown to be patterned to have an opening 310 over an under bump metallurgy (UBM) 140. FIG. 7 shows an illustration of a SEM image showing the final structure of the semiconductor device 100 after reflow. In particular, this figure shows a semiconductor device 100 having a patterned photoimageable permanent dielectric layer 210 having an opening over an under bump metallurgy (UBM) 140. Also, in this figure, a solder sphere 510 is shown to be applied to the under bump metallurgy (UBM) 140 of the semiconductor device 100. The height of the encasement structure can vary, and may be as tall as 75% of the bump diameter.

In one or more embodiments, the addition of a thicker photoimageable dielectric material layer to the disclosed semiconductor device would enable building the effective polymer layer higher and, thus, allow for a continuous layer of buffer against thermal expansion stress and mechanical shock, as well as allow for protection from corrosive elements. When employing the disclosed method, the thickness of the permanent dielectric material layer is easy to control, and can be altered to be application specific. The height of the effective encasement surrounding the solder sphere is important since prior art on wafer applied underfills has shown that as the underfill height-to-bump ratio is increased, the thermal cycle life is also increased. Prior art has also shown that as the underfill height-to-bump ratio is increased, the resistance to mechanical shock may also be increased.

In some embodiments, the height of the photoimageable permanent dielectric layer can be tailored to meet the needs of particular designs. In particular, the height of the photoimageable permanent dielectric layer can be tailored according to the types and sizes of the solder spheres being employed by the design. In at least one embodiment, the opening where the solder sphere sits can be completely filled-in or sealed with solder (or some other type of fluxing underfill material) after the reflow process for creating a continuous protective repassivation layer. This wafer level chip scale packaging (WLCSP) encasement approach is versatile, and can be used on standard sputtered metal and electroplated copper (Cu) applications as well as electroless Ni/Au and electroless Ni/Pd/Au under bump metallurgy (UBM) options. Since the disclosed method is a wafer level application, it is an attractive option compared to the current die level underfill method alternatives.

In alternative embodiments, the photoimageable permanent dielectric material is opened, and a polymer collar fluxing agent is dispensed into the opening. This method produces a modified blanket layer. For these alternative embodiments, the blanket coat material does not necessarily need to be photoimageable. However, the blanket coat material must be able to act as a fluxing agent, and be able to adhere the solder to the under bump metallurgy (UBM).

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

We claim:

1. A method for a semiconductor device using dielectric encasement, the semiconductor device comprising a substrate layer, a passivation layer overlying the substrate layer, and a plurality of under bump metallurgies (UBMs), each UBM extending onto a top surface of the passivation layer, the method comprising:

forming a photoimageable permanent dielectric layer overlying the passivation layer;

patterning the dielectric layer to form a plurality of openings in the dielectric layer, each opening positioned over a respective one of the UBMs, and each opening having a sidewall;

adding fluxing material into each of the plurality of openings;

applying solder to a respective top surface of the fluxing material in each of the openings; and heating the semiconductor device to a reflow temperature appropriate for the reflow of the solder, thereby causing the solder to conform to and fully cover the respective sidewall of each opening.

2. The method of claim 1, wherein the forming the dielectric layer comprises using a liquid dielectric.

3. The method of claim 1, wherein the forming the dielectric layer comprises using a dry film laminate.

4. The method of claim 1, wherein the dielectric layer has a thickness of 1-300 micrometers.

5. The method of claim 1, wherein the semiconductor device further comprises an input/output pad positioned on the substrate layer under one of the UBMs.

6. The method of claim 1, wherein after the patterning, the dielectric layer overlaps each of the UBMs by at least 1 micron.

7. The method of claim 1, wherein the semiconductor device the substrate layer comprises silicon.

8. The method of claim 1, wherein the solder is at least one solder sphere.

9. The method of claim 1, wherein the solder is a solder paste.

10. The method of claim 1, wherein after the heating, the solder forms a protective seal.

11. The method of claim 1, wherein after the heating, the solder completely fills each of the openings.

12. The method of claim 1, wherein the solder is a plurality of solder spheres, and after the heating, an outer surface of each solder sphere extends outward laterally beyond an edge of its respective opening.

13. The method of claim 1, wherein the solder contains no flux.

14. The method of claim 1, wherein the adding fluxing material comprises dispensing or stencil printing the fluxing material.

15. A method for a semiconductor device using dielectric encasement, the semiconductor device comprising a substrate layer, a passivation layer overlying the substrate layer, and a plurality of under bump metallurgies (UBMs), each UBM extending onto a top surface of the passivation layer, the method comprising:

applying a layer of a photoimageable permanent dielectric material overlying the passivation layer;

patterning the layer of the photoimageable permanent dielectric material to have a plurality of openings, each opening exposing a portion of a respective input/output pad;

applying solder, containing flux, into each of the plurality of openings; and heating the semiconductor device to a reflow temperature appropriate for the reflow of the solder, thereby causing the solder to conform to a respective sidewall of each of the openings and further to completely fill each of the openings.

16. The method of claim 15, wherein the layer of the photoimageable permanent dielectric material is a liquid dielectric.

17. The method of claim 15, wherein the layer of the photoimageable permanent dielectric material is a dry film laminate.

18. The method of claim 15, wherein the layer of the photoimageable permanent dielectric material has a thickness of 1-300 micrometers.

19. The method of claim 15, wherein after the heating, the solder forms a protective seal.

20. The method of claim 15, wherein the solder is a plurality of solder spheres, and after the heating, an outer surface of each solder sphere extends outward laterally beyond an edge of its respective opening.

* * * * *

UNITED STATES PATENT AND TRADEMARK OFFICE
CERTIFICATE OF CORRECTION

| | | |
|---|---|---|
| PATENT NO. | : 8,058,163 B2 | Page 1 of 1 |
| APPLICATION NO. | : 12/537236 | |
| DATED | : November 15, 2011 | |
| INVENTOR(S) | : John J. H. Reche et al. | |

It is certified that error appears in the above-identified patent and that said Letters Patent is hereby corrected as shown below:

Column 7, lines 25-26, delete "the semiconductor device"

Signed and Sealed this
Thirteenth Day of March, 2012

David J. Kappos
*Director of the United States Patent and Trademark Office*